United States Patent
Thiele et al.

(10) Patent No.: US 7,276,888 B2
(45) Date of Patent: Oct. 2, 2007

(54) PRECHARGE CIRCUIT FOR DC/DC BOOST CONVERTER STARTUP

(75) Inventors: Gerhard Thiele, Munich (DE); Kevin Scoones, Munich (DE); Thomas Keller, Freising (DE); Franz Prexl, Niederding (DE)

(73) Assignee: Texas Instruments Deutschland GmbH, Freising (DE)

( * ) Notice: Subject to any disclaimer, the term of this patent is extended or adjusted under 35 U.S.C. 154(b) by 298 days.

(21) Appl. No.: 11/053,318

(22) Filed: Feb. 7, 2005

(65) Prior Publication Data
US 2005/0180236 A1    Aug. 18, 2005

(30) Foreign Application Priority Data
Feb. 17, 2004    (DE) ...................... 10 2004 007 620

(51) Int. Cl.
*G05F 1/00*   (2006.01)
(52) U.S. Cl. ...................... 323/282; 365/203; 323/314; 323/222
(58) Field of Classification Search .................. 363/49, 363/50, 59, 60; 323/273, 274, 276, 315, 323/901, 225, 266, 259
See application file for complete search history.

(56) References Cited

U.S. PATENT DOCUMENTS

| | | | | | |
|---|---|---|---|---|---|
| 4,408,136 | A | * | 10/1983 | Kirsch | .......................... 326/70 |
| 5,745,423 | A | * | 4/1998 | Tai | .............................. 365/203 |
| 5,998,977 | A | | 12/1999 | Hsu et al. | |

FOREIGN PATENT DOCUMENTS

| | | |
|---|---|---|
| DE | 196 12 269 C1 | 8/1997 |
| DE | 697 07 463 T2 | 10/2001 |
| EP | 1 041 480 A1 | 10/2000 |

* cited by examiner

*Primary Examiner*—Patrick Assouad
*Assistant Examiner*—Emily P Pham
(74) *Attorney, Agent, or Firm*—Wade J. Brady, III; Frederick J. Telecky, Jr.

(57) ABSTRACT

An integrated circuit including a precharge circuit for a DC/DC boost converter which includes a reference current circuit with a MOSFET transistor (MP4) that has a gate connected with the gate of the DC/DC boost converter's power MOSFET transistor (MP5) to form a current mirror. The precharge circuit works to approach the output voltage to the supply voltage prior to the converter startup. An included regulation circuit adjusts the gate potential at the power MOSFET transistor (MP5) and at the MOSFET transistor (MP4) in the reference circuit in response to a reduction of the drain-source voltage of the power MOSFET transistor (MP5) due to precharging load capacitance, in a sense to keep the precharge current through the power MOSFET transistor (MP5) constant.

9 Claims, 2 Drawing Sheets

PRECHARGE CIRCUIT FOR DC/DC BOOST CONVERTER STARTUP

CROSS REFERENCE TO RELATED APPLICATIONS

This application claims priority under 35 USC § 119 of German Application Serial No. 102004007620.0, filed Feb. 17, 2004.

FIELD OF THE INVENTION

The present invention relates to an integrated circuit including a DC/DC boost converter with a precharge circuit. Such a DC/DC boost converter typically includes an inductor and a power MOSFET transistor connected in series with the inductor between a supply terminal and a first end of a load that has a second end connected to ground.

BACKGROUND OF THE INVENTION

To start the DC/DC boost converter, the voltage difference between the input voltage and the output voltage should be small to avoid high current spikes in the inductor of the converter or even failure of the converter to start operation. A precharge circuit is thus needed to raise the output voltage in a precharge mode to a level close to the input voltage before the actual boost mode operation of the converter can be started.

In the precharge mode, when the output voltage approaches the input voltage, the precharge current decreases due to a decrease of the drain-source voltage of the power MOSFET transistor, thereby limiting the maximum allowed load during startup and furthermore increasing the duration of the precharge mode, delaying the start of the actual boost mode operation.

SUMMARY OF THE INVENTION

The present invention provides an integrated precharge circuit for a DC/DC boost converter that first allows to charge the output capacitor and thus the output voltage up to a level very close to the input voltage even for relatively high load currents and second allows to speed-up the precharge process by making the precharge current substantially independent of the output voltage.

Specifically, the invention provides an integrated precharge circuit for a DC/DC boost converter, comprising an inductor and a power MOSFET transistor connected in series with the inductor between a supply terminal and a first end of a load that has a second end connected to ground. The precharge circuit further comprises a reference current circuit connected to a MOSFET transistor the gate of which is connected to the gate of the power MOSFET transistor to realize a current mirror. A regulation circuit is provided for adjusting the gate potential of the current mirror realized with the power MOSFET transistor and the MOSFET transistor in the reference current circuit in response to a reduction of a voltage drop across the power MOSFET transistor, in a sense to increase the precharge current through the power MOSFET transistor or to keep such current constant. Accordingly, when the precharge current tends to decrease due to a decrease of the voltage drop between drain and source of the power MOSFET transistor, the gate potential of the power MOSFET transistor is decreased and thus the gate-source voltage increased in order to increase the current through the power MOSFET transistor, which first allows to charge the output capacitor and thus the output voltage up to a level very close to the input voltage even for relatively high load currents and second significantly reduces the delay before operation in the actual boost mode can be started.

A problem that occurs in DC/DC boost converters for low input voltages is thermal protection. Conventional thermal protection circuits require a reference voltage such as provided by a band-gap voltage reference. A band-gap voltage reference operative below 1.2 volt is often not available or requires significantly more current. Therefore, conventional thermal protection circuits are ineffective at a supply voltage below 1.2 volt.

The present invention provides a solution to this problem as well. Specifically, in the preferred embodiment of the invention, the precharge circuit includes an on-chip bipolar transistor with a base-emitter path connected across the current source (resistor) in the reference current circuit and a collector connected to the gates of the first and second control MOSFET transistors. With an increase of chip temperature, e.g. due to a short circuit at the output of the converter, the base-emitter voltage of the bipolar transistor decreases. This causes a reduction of the voltage drop across the current source (resistor) in the reference current circuit and, consequently, a reduction of reference current through that circuit. This effect can be further improved by realizing the current source (resistor) in such a way that it exhibits a positive temperature coefficient, i.e. the current derived from this current source decreases even more with increasing die temperature. Therefore, the current mirrored to the power MOSFET transistor and, as a consequence, the output current decreases. In this embodiment, a band-gap voltage source is not required. Instead, the temperature-dependent emitter-base voltage of a bipolar transistor is used as a reference. The converter starts reliably even with a high load limited only by the thermal impedance seen by the device in a particular application. The maximum power dissipation of the integrated circuit is reliably kept below a critical value.

DETAILED DESCRIPTION OF THE DRAWINGS

Figure 1:
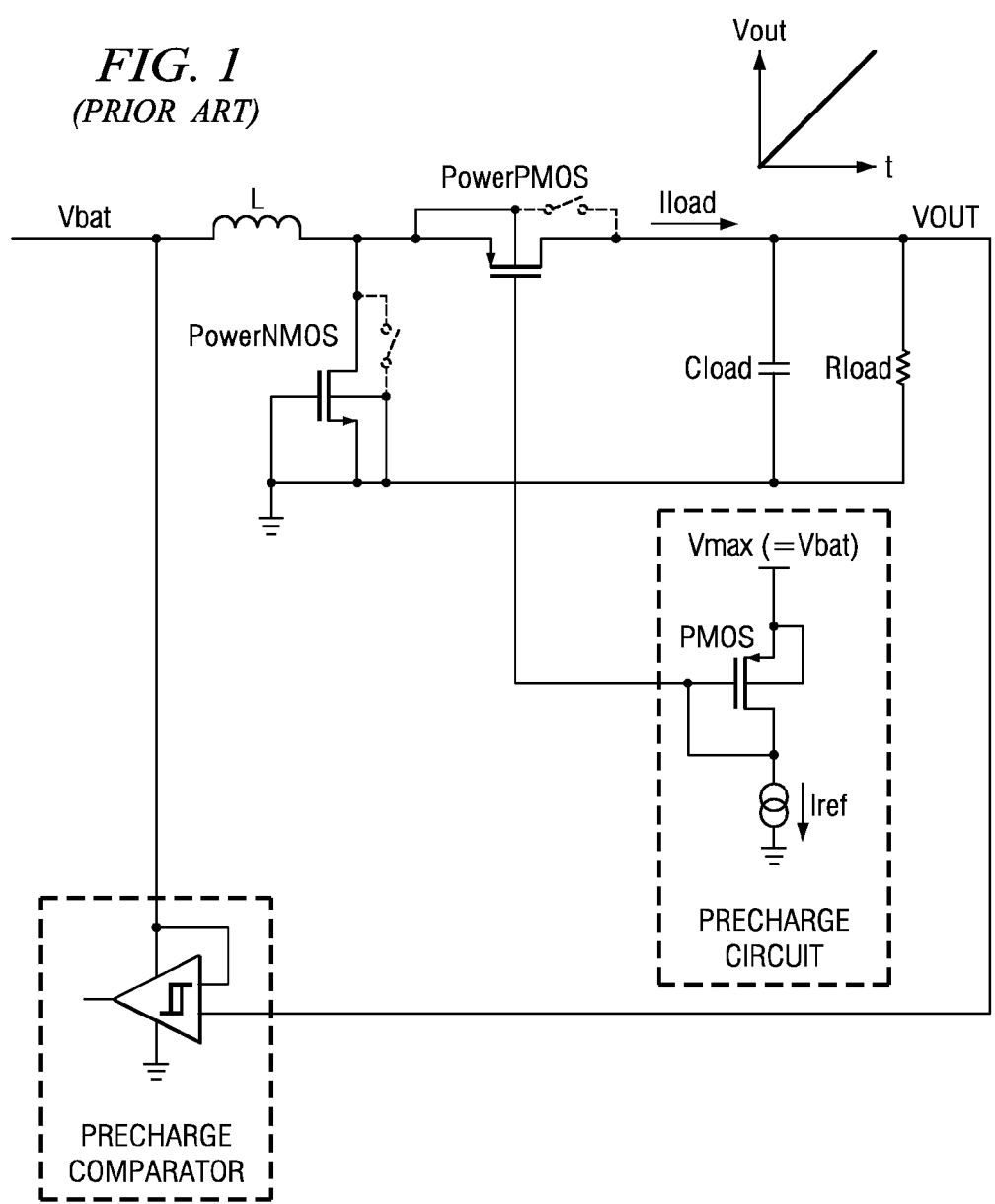
FIG. 1 is a circuit diagram of relevant parts in a conventional DC/DC boost converter.

The conventional integrated DC/DC boost converter in FIG. 1 comprises an inductor L that has a first end connected to a supply terminal Vbat, a power PMOS transistor the source of which is connected to the second end of the inductor L, an NMOS power transistor connected between the second end of inductor L and ground with its gate connected to ground thus being disabled, and a precharge circuit that has a control output connected to the gate of the PMOS power transistor. The drain of the power PMOS transistor provides an output Vout of the converter and supplies a current Iload into a load assumed here as a load resistor Rload and a capacitor Cload in parallel with Rload. Conventional control circuitry for normal operation of the converter is also included on-chip (not shown). The precharge circuit mainly consists of a PMOS reference transistor connected in series with a reference current source Iref between supply terminal Vbat and ground. The power PMOS transistor has its gate connected with the gate of the PMOS reference transistor so that the power PMOS transistor "mirrors" the reference current Iref through the PMOS reference transistor.

Figure 1A:
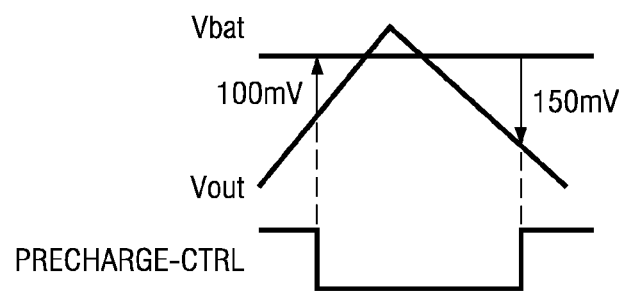
FIG. 1a is an example of a precharge control signal as a function of the DC/DC boost converter output voltage Vout, generated by the precharge comparator in FIG. 1.

A precharge comparator compares the input voltage at Vbat with the output voltage Vout of the converter. When initially enabled, the output voltage Vout is zero, and the comparator provides a precharge control signal. The precharge control signal causes the power NMOS transistor to be OFF and the power PMOS transistor to be connected to the precharge circuit, thereby raising the output voltage Vout. With reference to FIG. 1a, when the output voltage Vout approaches the input voltage Vbat (e.g. Vout=Vbat−100 mV), the precharge control signal is deactivating the precharge mode disconnecting the precharge circuit from the power PMOS and the converter is switched to normal operation. The comparator has a hysteresis so that the precharge control signal gets active again when the output voltage Vout has decreased to a value somewhat lower than the value at which the precharge control signal was deactivated (e.g. Vout=Vbat−150 mV).

Figure 2:
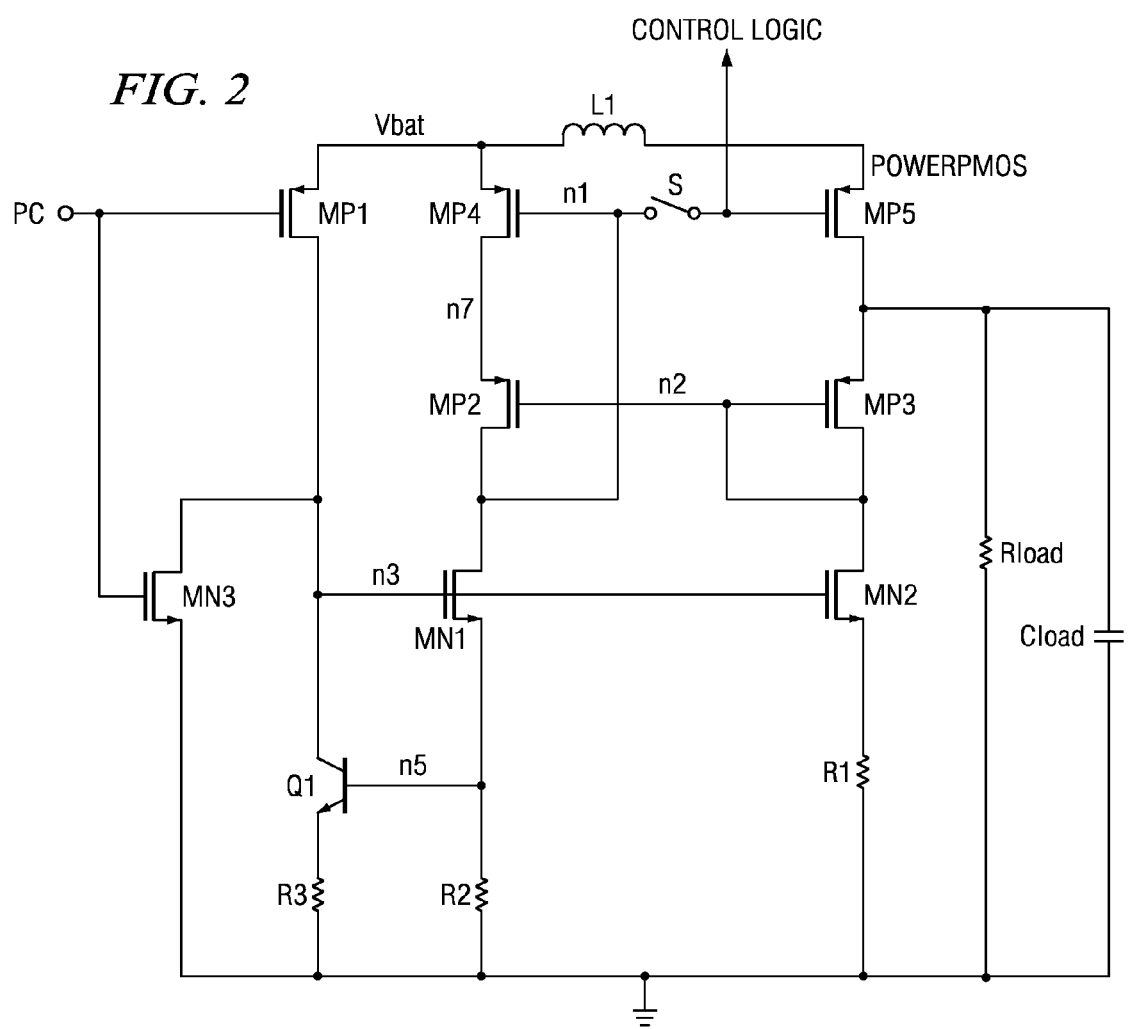
FIG. 2 is a circuit diagram of the relevant parts of a DC/DC boost converter during precharge mode according to an embodiment of the invention.

The circuit diagram in FIG. 2 shows the schematic of the relevant parts of an integrated DC/DC boost converter with a precharge circuit during precharge mode, according to an embodiment of the invention. The precharge circuit first allows charging the output capacitor and thus the output voltage up to a level very close to the input voltage Vbat, even at relatively high load currents. Second the precharge circuit speeds-up the precharge process by making the precharge current substantially independent of the output voltage; and third the precharge circuit integrates a thermal protection functionality. The DC/DC boost converter comprises an inductor L1, which has a first end connected to the source of a PMOS transistor MP4 and the supply voltage Vbat and the other end to the source of a Power PMOS transistor MP5. The drain of MP5 is connected to a first end of a load, which consists here of a resistor Rload connected in parallel to a capacitor Cload. The second end of the load is connected to ground. The voltage across the load is the output voltage Vout. The drain of MP5 is also connected to the source of a PMOS transistor MP3, the drain of MP4 is connected to the source of a PMOS transistor MP2. The gates of the PMOS transistors MP4 and MP5 are interconnected at node n1 via a switch S, thus MP4 and MP5 are forming a current mirror with switch S closed. In a current mirror, the mirrored drain-source currents are proportional to the W/L (width/length) ratios of the transistors. Furthermore, the gates of the PMOS transistors MP4 and MP5 at node n1 are connected to the drain of PMOS transistor MP2. Gate MP5 is connected to a high-resistive terminal of logical circuitry. Switch S is situated between node 1 and this connection. In precharge mode switch S is closed, while it is opened in boost mode, thus separating the gate of power PMOS transistor MP5 from the reference current circuit. The gates of the PMOS transistors MP2 and MP3 are interconnected at node n2 and connected to the drain of PMOS transistor MP3. Thus the transistors MP2 and MP3 are each connected in cascode with MP4 and MP5, respectively. The transistors MP2 and MP3 are of same size. The drain of PMOS transistor MP2 is connected to the drain of a NMOS transistor MN1 and the drain of PMOS transistor MP3 is connected to the drain of a NMOS transistor MN2. The gates of these two transistors MN1 and MN2 are interconnected; the source of MN1 is connected via resistor R2 and the source of MN2 via resistor R1 to ground. Transistors MN1 and MN2 are of same size, resistor R1 and resistor R2 have the same value. MN1, R2, Q1, R3 and MP1 realize the reference current circuit that keeps the dependency of the precharge current on the supply voltage low and furthermore decreases the precharge current with increasing temperature. Transistors MN1 and MN2 are control NMOS transistors. Their gates are connected at node n3 to the drains of a PMOS transistor MP1 and a NMOS transistor MN3. The gates of these transistors MP1 and MN3 are connected to receive a precharge control signal, as applied to a terminal PC. The source of transistor MP1 is connected to Vbat, the source of transistor MN3 is connected to ground. For thermal protection a bipolar transistor Q1 is connected with its base to the source of NMOS transistor MN1, with its collector to the gates of NMOS transistors MN1 and MN2 at node n3 and with its emitter via a resistor R3 to ground.

In the precharge mode the output voltage Vout rises, and the drain-source voltage VDS of transistor MP5 decreases. With the connection of the drain of transistor MP3 to the gate of transistor MP3, the gate voltage at node n2 increases slightly. This leads to a decrease of the gate-source voltage of transistor MP2. With a constant current through transistor MP2 and R2, the drain potential of transistor MP2 decreases. As the drain is connected to the gates of transistors MP4 and MP5, the voltage at node n1 decreases. With a lower gate potential at MP5, the gate-source voltage VGS of this transistor MP5 increases. Increasing the gate-source voltage VGS of a PMOS transistor leads to a higher output current. Thus the output current (i.e. drain-source current) of the power PMOS transistor MP5 is increased and this consequently first allows to charge the output voltage up to a voltage level very close to the input voltage Vbat, even at relatively high load currents and second speeds-up the precharge process by making the precharge current substantially independent of the output voltage. The precharge circuit becomes nearly independent from Vout and can supply the load with enough current.

In case of a short-circuited output, the output current must be limited to avoid destruction of the device by an over temperature. The base-emitter voltage VBE of transistor Q1 is temperature dependent: with an increase in temperature the base-emitter voltage VBE of the transistor Q1 decreases. The base-emitter of Q1 is connected across the resistance R2. If, due to a short-circuit at the output, the chip temperature increases, the voltage VBE decreases and thus the voltage drop over R2 decreases. With this voltage drop, the current through R2 goes down. This current is mirrored to MP5, thus the current through the power PMOS transistor MP5 decreases which leads to a decreased output current. An even higher decrease of the output current with increasing temperature can be achieved if resistor R2 (and resistor R1) is realized with positive temperature coefficient i.e. the resistance is increasing with temperature. In a further embodiment, bipolar transistor Q1 is replaced by a NMOS transistor. In the latter embodiment, the NMOS transistor has its gate connected to node n5, its drain connected to node n3 and its source connected to ground either directly or through a resistor.

The transistors MP1 and MN3 both receive a precharge control signal at their gates similar to the one explained with reference to FIG. 1a. The precharge signal is given by a comparator, which is not shown in FIG. 2. With the precharge control signal the NMOS transistor MN3 opens and the PMOS transistor MP1 closes, so that the precharge circuit is activated.

The invention claimed is:

1. An integrated circuit comprising a DC/DC boost converter with a precharge circuit comprising:
   an inductor (L1) and a power MOSFET transistor (MP5) connected in series with the inductor (L1) between a supply terminal (Vbat) and a first end of a load (Rload, Cload) that has a second end connected to ground, and further includes a reference current circuit with a MOSFET transistor (MP4) that has a gate connected with the gate of the power MOSFET transistor (MP5) and a source connected to the supply terminal to form a current mirror,
   wherein a regulation circuit is provided for adjusting the gate potential (n1) at the power MOSFET transistor (MP5) and at the MOSFET transistor (MP4) in the reference current circuit in response to a reduction of the drain-source voltage of the power MOSFET transistor (MP5), in a sense to keep the precharge current through the power MOSFET transistor (MP5) substantially constant or to increase the current.

2. The integrated circuit according to claim 1, wherein the regulation circuit comprises a first cascode MOSFET transistor (MP3) connected in series with a first control MOSFET transistor (MN2) between the first end of the load (Rload,Cload) and ground.

3. The integrated circuit according to claim 2, wherein the regulation circuit comprises a second cascode MOSFET transistor (MP2) that is part of the reference current circuit and is connected in series between a second control MOSFET transistor (MN1) connected to ground and a the MOSFET transistor (MP4) connected to the supply terminal (Vbat), the first and second cascode MOSFET transistors (MP3, MP2) having their gates connected with each other.

4. The integrated circuit according to claim 3, further including an on-chip bipolar transistor (Q1) with a base-emitter path connected across a current source (R2) in the reference current circuit and a collector connected to the gates of the first and second control MOSFET transistors (MN2, MN1) and to the drain of a PMOS transistor (MP1) that has its source connected to the supply terminal.

5. The integrated circuit according to claim 4, wherein the emitter of the bipolar transistor (Q1) is connected to ground through a resistor (R3).

6. The integrated circuit according to claim 5, including a NMOS transistor with a gate connected to a resistor in the reference current circuit, a source connected to ground and a drain connected to the gates of the first and second MOSFET transistors (MN2, MN1).

7. The integrated circuit according to claim 1, wherein the reference current circuit includes a resistor (R2) that has a positive temperature coefficient and is connected to ground.

8. The integrated circuit according to claim 4, and further comprising an inverter formed by a complementary MOSFET transistors (MP1, MN3) having an input receiving a precharge control signal (PC) and an output connected to the collector of the on-chip bipolar transistor (Q1).

9. The integrated circuit according to any of claim 1, wherein the gate of the power MOSFET transistor (MP5) is connected to the gate of the MOSFET transistor (MP4) in the reference current circuit by a switch that is closed in the precharge mode and open in the normal boost operation mode.

* * * * *